United States Patent [19]
Ishida et al.

[11] Patent Number: 5,154,795
[45] Date of Patent: Oct. 13, 1992

[54] SYSTEM FOR SETTING ANALYSIS CONDITION FOR A THERMAL ANALYSIS OF A FLUID INSIDE AN APPARATUS

[75] Inventors: Masanobu Ishida, Yokohama; Yukio Yamaguchi, Kawasaki; Fumio Orito, Abiko; Kizuku Katano, Tsukuba; Hideo Okada, Chikushino; Fumikazu Yajima, Inashiki, all of Japan

[73] Assignees: Mitsubishi Kasei Polytec Company; Mitsubishi Kasai Corporation, both of Japan

[21] Appl. No.: 535,769

[22] Filed: Jun. 11, 1990

[30] Foreign Application Priority Data

Jun. 12, 1989 [JP] Japan .................................. 1-149240
Mar. 2, 1990 [JP] Japan .................................. 2-51337

[51] Int. Cl.$^5$ ............................................. C30B 15/22
[52] U.S. Cl. ................................. 156/601; 156/617.1; 156/607; 422/249.1; 422/109
[58] Field of Search ...................... 156/601, 607, 617.1; 422/109, 249

[56] References Cited

U.S. PATENT DOCUMENTS 3,639,718  2/1972  Castonguay et al. ............... 422/109
4,936,947  6/1990  Mackintosh ......................... 156/601

FOREIGN PATENT DOCUMENTS 255554  4/1988  German Democratic Rep. ..................................... 156/601

OTHER PUBLICATIONS

Thyagurajan et al., "Growth of GaAs Single Crystals by Liquid Encapsulated Czochralski Technique", Indian Journal of Puretx Applied Plysics, vol. 17, Oct. 1979, pp. 650–654.

*Primary Examiner*—Robert Kunemund
*Attorney, Agent, or Firm*—Burgess, Ryan & Wayne

[57] ABSTRACT

A system for setting an analysis condition for a thermal analysis of a fluid inside an apparatus, wherein a gas flow-in temperature in the apparatus, a gas flow-in rate, and an apparatus outer wall temperature are set as critical conditions, the interior of the apparatus being under a high pressure atmosphere and heated by a heater, an analysis mesh shape, a pressure inside the apparatus and other values, and a heater power, are set as initial values, and a simulation is carried out so that an optimum operating condition is obtained, wherein the relationship between heater power by which a heater monitoring temperature is maintained at a constant value and a gas flow rate at the entrance while changing the apparatus internal pressure is obtained by a trial experiment, and the simulation is carried out by changing the gas flow rate at the entrance in accordance with the heater power and the gas flow rate at the entrance set as the initial value.

6 Claims, 7 Drawing Sheets

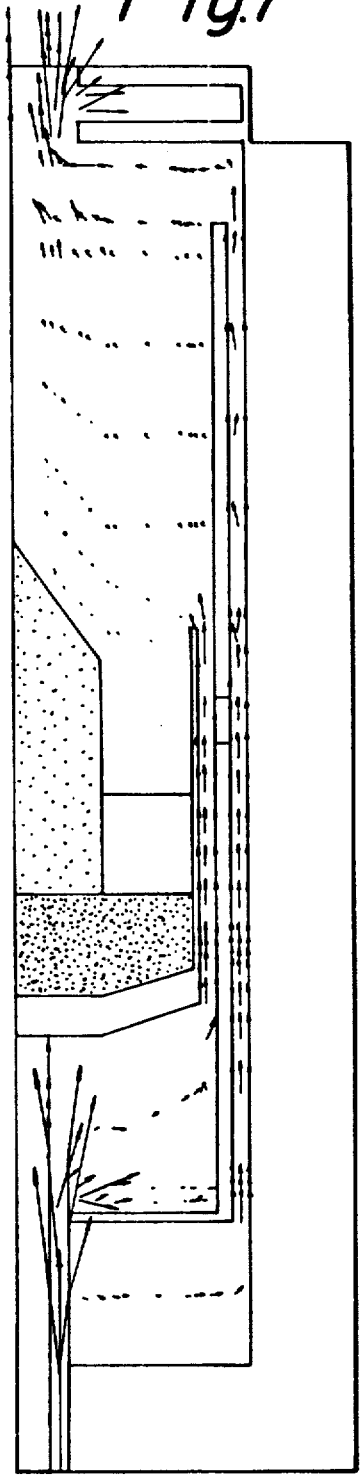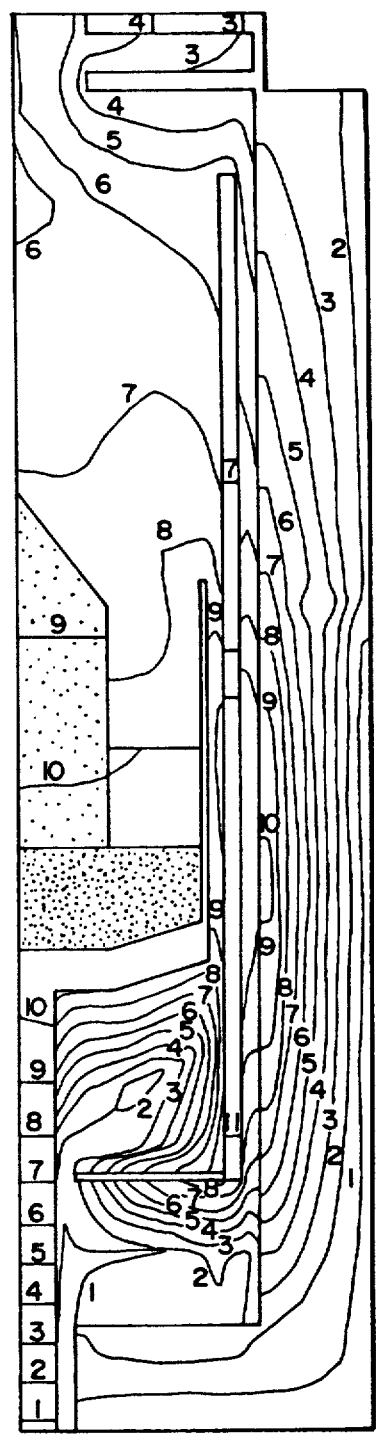

TEMPERATURE DIFFERENCE FROM SOLID INTERFACE (kg/cm²)

SYSTEM FOR SETTING ANALYSIS CONDITION FOR A THERMAL ANALYSIS OF A FLUID INSIDE AN APPARATUS

BACKGROUND OF THE INVENTION

1. Field of the Invention

The present invention relates to system for setting analysis conditions for a thermal analysis of a fluid inside an apparatus, and more particularly, to a system for setting analysis conditions for a thermal analysis of a fluid inside an apparatus, wherein a gas flow-in temperature in the apparatus, a gas flow-in rate, and an apparatus outer wall temperature, etc. are set as boundary conditions, the interior of the apparatus being under a high pressure atmosphere and heated by a heater, an analysis mesh shape, a pressure inside the apparatus and other values, and a heater power, etc., are set as initial values and a simulation is carried out in such a manner that an optimum apparatus operating condition is obtained.

2. Description of the Related Art

A GaAs single crystal is known to be particularly suitable as a substrate material for high speed IC's, and optical devices, etc., and thus an increasing amount of research thereinto is underway.

As a method of producing a single crystal, an LEC (Liquid Encapsulated Czochralski) method is the most widely used method of producing a III-V group compound semiconductor bulk crystal, as this method enables a circular wafer to be easily obtained.

The bulk crystal growth of the III-V group compound semiconductor must be carried out under a complex heat environment, such as a high temperature and a high pressure, due to the properties of the III-V group compounds, and to grow a crystal having a lower dislocation density by the bulk crystal growth process, the heat environment must be eased to lower the thermal stress. On the other hand, to increase productivity, the temperature gradient must be made larger to provide a stronger oriented solidification. These requirements, however, are contrary to each other.

In a single crystal pulling apparatus used for the Czochralski (CZ) method, an insulating material must be provided in the apparatus and a multi-stage control heater used, and thus the control of the bulk crystal growth is very complex and difficult.

FIG. 1 shows a schematic cross-sectional view of a single crystal pulling apparatus used in an LEC process.

In FIG. 1, reference numeral 31 denotes a water-cooled reflector, 32 graphite heat shield, 33 an upper-heater, 34 a main heater, 35 a lower-heater, 36 a crucible, 37 a crystal, 38 a melt, 39 $B_2O_3$ (boron oxide) encapsulant, and 40 heat insulating felt.

The inside of the single crystal pulling apparatus is maintained under, for example, a nonvolatile high pressurized argon (Ar) atmosphere and heated to bring the inside of the crucible 36 to 1511° K. or more, which is the melting point of GaAs. Then, while computing the growing crystal shape from various measured values, the heater power, the crystal pulling speed, the speed of rotation of the crucible 36 and the crystal 37, etc., are controlled. In this case, the computation of the growing crystal shape is carried out by detecting the weight of the crystal through a load cell and measuring changes in the weight of the crystal while compensating the buoyancy for $B_2O_3$ encapsulant 39 and the surface tension of the melt 38.

The most important condition in the LEC method of crystal growth is the heat environment in the apparatus. Namely, to obtain a high quality crystal at a high productivity, a knowledge of the heat environment is indispensable.

Nevertheless, since the inside of the apparatus is filled with the high temperature and the high pressurized atmosphere as explained above, and the apparatus has a complex internal structure, the whole of the apparatus interior can not be directly observed during the growth of the crystal, and therefore, to obtain a desired heat environment, a computer simulation must be carried out, and thus many different analyses have been attempted. For example, analyses of the apparatus internal temperature profile, the crystal internal temperature profile, the melt internal heat convection, a shape analysis of the solid-liquid interface wherein the crystal and melt are continuously formed, and the crystal internal thermal stress analysis, etc., are carried out.

Nevertheless, the above-mentioned various numerical analyses and the analysis by computer simulation are carried out by using a single element, respectively, and are not analyses in which there is a relationship between each of the elements. Therefore, these analyses are not directly connected to the operating condition of the apparatus, and thus it has been difficult to determine how to quantitatively change the settings for the apparatus operation in order to obtain the optimum condition of the apparatus internal heat environment, based on the analyzed results.

Further, a matching of the simulation results and the operation of the actual apparatus has been difficult.

Particularly, to obtain a long single crystal technique for controlling a solid-liquid interfacial shape of a growing crystal with a multi-zone heater must be established, and control of the heat flow in the single crystal pulling apparatus is also required.

Further, an experiment using a single crystal pulling apparatus requires much time and labor, and a computer simulation is more efficient. Nevertheless, to enhance the accuracy of the simulation, precise information on the heat transfer in the apparatus must be obtained.

Furthermore, to increase the productivity, a mass charge, i.e., an enlargement of a crucible, is necessary. This enlargement of the crucible is needed when attempting to obtain a wafer having a large diameter, but usually, the overall size of the apparatus is fixed, and thus the necessary dimensional changes of the apparatus can not be made. Further, because a heater by which the temperature in the apparatus is controlled is provided outside the crucible, when the crucible is enlarged, the insulation for the crucible must be made thinner, and thus the problem of safety arises.

The most important factor when forming a model of the thermal flow in a chamber is that the thermal flow must be quantitatively treated in a thermal-balanced state. Accordingly, in the LEC method, the treatment of a nonvolatile gas, for example, argon (Ar), which is used under a high pressure, e.g., 10 to 13 atm is important.

A thermal balance model in an apparatus containing a high pressure Ar gas will now be briefly explained with reference to FIG. 2. In the thermal balance model illustrated in FIG. 2, the encircled points ① to ⑯ shown in FIG. 1 are specified as positions at which a typical temperature in a single crystal pulling apparatus is exhibited, to obtain the thermal balance thereat.

In the thermal balance model, the direction of convection is shown by a flow, i.e., gas 3→gas 4→upper heater→above inside and outside an upper insulating containers→between the outside of the insulating containers and the outer wall→gas 1 under the inside and outside lower insulating containers→gas 2→gas 3.

The thermal flows, i.e., heat transfer (—), heat radiation (=) and convection heat transfer (- - -) arise between the respective points ①  to ⑯ . For example, at the point ($T_{cr}$) of the position ① of the crucible bottom, a heat radiation occurs between the main heater ($T_M$) and the point ($T_{cr}$), a heat transfer ($C_d$) occurs between a pedestal ($T_{pd}$) and the point ($T_{cr}$), and a convection heat transfer ($C_v$) occurs between a gas 2 ($T_{g2}$) and a gas 3 ($T_{g3}$), and thus a thermal balance is formed. Namely, a quantity of heat is transferred by the Ar flow, and a thermal balance based on the heat transfer, the heat radiation, and the convection heat transfer is maintained between the specified points ① to ⑯ , whereby an overall thermal balance model is formed. To carry out a thermal fluid analysis using such a thermal balance model, to thereby determine the optimum operating condition for a single crystal pulling apparatus, an enormous number of treatments must be repeatedly carried out, and a computer simulation using the finit element method, etc., is made.

When an analysis of the thermal fluid at, for example, the crystal and at the melt is made, conventionally this analysis is made on the basis of the heat transfer and convection heat transfer data. Further when an analysis of a thermal fluid in an apparatus is made, this analysis is made on the basis of the heat transfer and heat radiation data. In such conventional analyses, in which a fully combined analysis is not carried out, a required accuracy is not obtained. Further, in the conventional thermal fluid analysis using a computer simulation, a temperature distribution of a heater is set as an initial value, but since the temperature distribution of the heater is varied by various conditions in the apparatus, it is difficult to accurately set the value of the temperature distribution.

SUMMARY OF THE INVENTION

An object of the present invention is to provide a system for setting analysis conditions for an analysis of a thermal fluid inside an apparatus, by which the analysis conditions in a computer simulation can be easily set and the accuracy of the analysis is enhanced.

Another object of the present invention is to provide a system for obtaining an analysis of an optimum condition of a single crystal pulling apparatus, by which the analysis can be efficiently and accurately carried out by suing a simulation of the apparatus conditions.

A further object of the present invention is to provide a control system for a single crystal pulling apparatus in which the pulling of the single crystal can be efficiently controlled by using the results of the analysis.

Therefore, according to the present invention, there is provided a system for setting analysis conditions for a thermal analysis of a fluid inside an apparatus, wherein a gas flow-in temperature in the apparatus, a gas flow-in rate, and an apparatus outer wall temperature, etc., are set as boundary conditions, the interior of the apparatus being under a high pressure atmosphere and heated by a heater, an analysis mesh shape, a pressure inside the apparatus and other values, and a heater power, etc., are set as initial values and a simulation is carried out in such a manner that an optimum apparatus operating condition is obtained, comprising:

establishing the relationship between a heater power by which a heater monitoring temperature is maintained at a constant value and a gas flow rate at the entrance of the apparatus, while changing the apparatus internal pressure by trial experiments; and carrying out the simulation by changing the gas flow rate at the entrance in accordance with the heater power and the gas flow rate at the entrance set as the initial value thereof.

According to the present invention, there is further provided a system for obtaining an analysis of an optimum condition for the operation of a single crystal pulling apparatus, comprising:

a thermal fluid analysis means in which an analysis of the temperature internal the apparatus is carried out based on the internal condition of a set apparatus, the boundary condition, and the heater power;

a solid-liquid interfacial shape analysis means by which a thermal analysis of a crystal and a melt is carried out by using the temperature profile obtained by the thermal fluid analysis means as a boundary condition, whereby a solid-liquid interfacial analysis of the crystal and melt is carried out, and a thermal stress analysis means in which an analysis of a thermal stress in the crystal is carried out by using the solid-liquid interfacial shape of the crystal obtained by the solid-liquid interfacial shape analysis means, and a temperature profile.

Still further, there is provided a control system for a single crystal pulling apparatus comprising:

a condition setting means by which the apparatus internal condition, the boundary condition, and heater power are set, a thermal fluid analysis means by which an analysis of the apparatus internal temperature profile is carried out based on the condition set by the condition setting means;

a solid-liquid interfacial shape analysis means in which a thermal analysis of the crystal and melt is carried out by using the temperature profile obtained by the thermal fluid analysis means as a boundary condition, whereby a solid-liquid interfacial analysis of the crystal and melt is carried out;

a thermal stress analysis means by which an analysis of a thermal stress in the crystal is carried out by using the solid-liquid interfacial shape of the crystal obtained by the solid-liquid interfacial shape analysis means, and a temperature profile, a monitoring means for monitoring an operating state when pulling a single crystal; and a control means for controlling the pulling of the single crystal during the monitoring by the monitoring means, by using the condition set by the condition setting means as a control signal.

The system is constructed in such a manner that the conditions set by the condition set means are appropriately compensated by the evaluations of the analysis results by the thermal fluid analysis means, solid-liquid interfacial shape analysis means, and thermal stress analysis means.

BRIEF DESCRIPTION OF THE DRAWINGS

FIG. 7 is a view of an example of a gas flow inside an apparatus;

FIG. 8 is a view of an example of an apparatus internal temperature profile;

DESCRIPTION OF THE PREFERRED EMBODIMENTS

Figure 3:
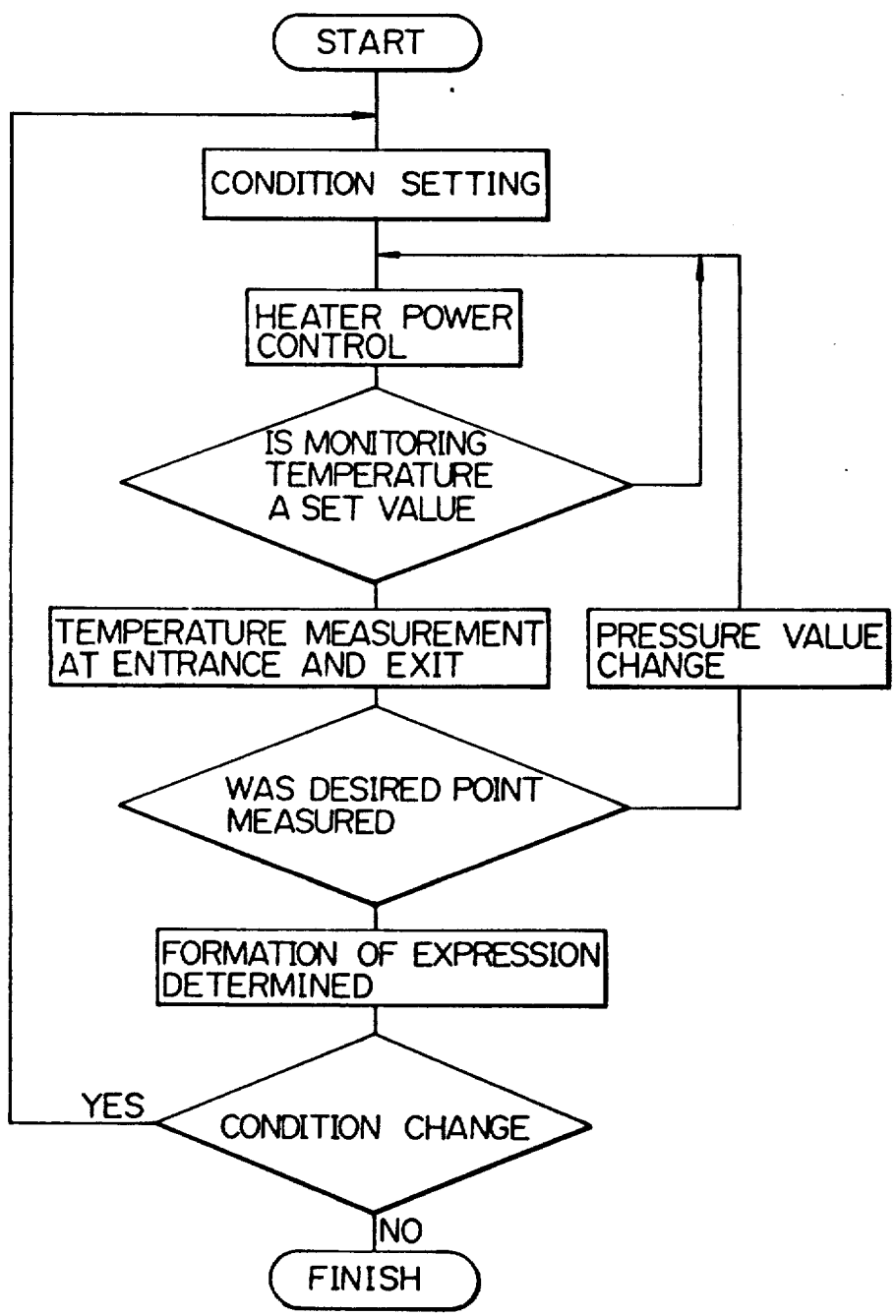
FIG. 3 is a view explaining one example of a system for setting an analysis condition for a thermal analysis of a fluid inside an apparatus, according to the present invention.

FIG. 3 is a view explaining one example of a system for setting an analysis condition for a thermal analysis of a fluid inside an apparatus, according to the present invention.

First, the effect on the thermal balance in a chamber of the argon (Ar) flow will be considered. The macro thermal balance in vacuum can be considered as the heat transfer due to the heat radiation from the outer surface of the hot zone to the surfaces of a reflector and chamber. Nevertheless, when the inside of the chamber is heated by a heater while flowing high pressure Ar therein, the buoyant Ar gas as shown in a direction of a convection in FIG. 2 flows out of the upper portion of the hot zone, is subjected to a thermal exchange at the upper portion of a water-cooled reflector chamber, and then flows down between the side wall of the chamber and the outer wall of hot zone with the result that a heat loss is generated. Namely, when the interior of the apparatus is maintained under a high pressure atmosphere, a heat loss due to the convection heat transfer is generated. Therefore, when the atmosphere inside the apparatus is changed from a vacuum to an Ar high pressure atmosphere, the electrical power of the main heater must be increased because of the heat loss caused by the convection heat transfer, to keep a temperature at a monitoring point at a constant value, for example. Namely, the thermal balance can be maintained by an increase of the electrical power, and the pressure in the apparatus and the convection heat transfer are closely related to each other.

From this viewpoint, in a computer simulation analysis, a temperature and flow rate at a gas entrance, a heater power, and a temperature at an outer wall are set, the convection can be determined by the flow rate at the gas entrance, and the temperature profile can be obtained at a model from the gas entrance to the gas exit by combining the convection with the heat radiation.

The well known expression of the convection heat transfer for a fluid, heat quantity q (W) carried by 16 atm. Ar gas ($\rho = 6.12 \times 10^{-3}$ g/cm$^3$, Cp=0.52 J/gK), which transfers at a flow rate v (cm/sec) in a sectional area S (cm$^2$), is expressed by the following expression when a temperature difference $\Delta T$ (K) exists between the gas entrance and the gas exit.

$$q = \rho C_p v S \Delta T.$$

In the present invention, the flow rate at the gas entrance, the gas temperature in the apparatus, and the outer wall temperature, which are boundary conditions, are mesh-divided as initial values by a finite element method whereby the mesh condition (solid state properties, etc.) and the heater power are set, the analysis of the heat fluid in the chamber is carried out, and the temperature profile in the apparatus is obtained. In this case, after obtaining the flow rate v at the gas entrance connected to the heater power, i.e., quantity q of heat corresponding to the loss generated by the convection heat transfer, the boundary condition of the thermal fluid obtained by the thermal fluid analysis, and the initial value, are set, and thus a trial experiment as shown in FIG. 3 is carried out.

In this trial experiment, before carrying out the heat analysis of a fluid inside the apparatus by mesh-division using a finite element method, the conditions of the pressure in the apparatus and the heater monitoring temperature, etc., are set. After setting these conditions, the interior of the apparatus is first brought to a vacuum state, and a heater power is controlled so that the heater monitoring temperature becomes a set value. Then, the pressure in the apparatus is set to a state at which a thermal fluid analysis can be carried out, and the heater power is controlled so that the heater monitoring temperature becomes a set value. Thereafter, the temperatures at the gas entrance and the gas exit are measured.

The difference $\Delta T$ between the temperatures at the gas entrance and the gas exit when the interior of the apparatus is maintained under a desired pressure, and the difference q between the heater power $Q_v$ when the interior of the apparatus is in a vacuum state, and the heater power $Q_{p1}$ when a pressure exists inside the apparatus, i.e., $Q_{p1} - Q_v$, are obtained from experimental data and the flow rate v (cm/sec) at the gas entrance is obtained from an expression: $q = Q_{p1} - Q_v$. On the other hand, by changing the apparatus internal pressure and the heater monitoring temperature, experimental data is obtained and the flow rate v corresponding to respective set values is obtained.

Figure 1:
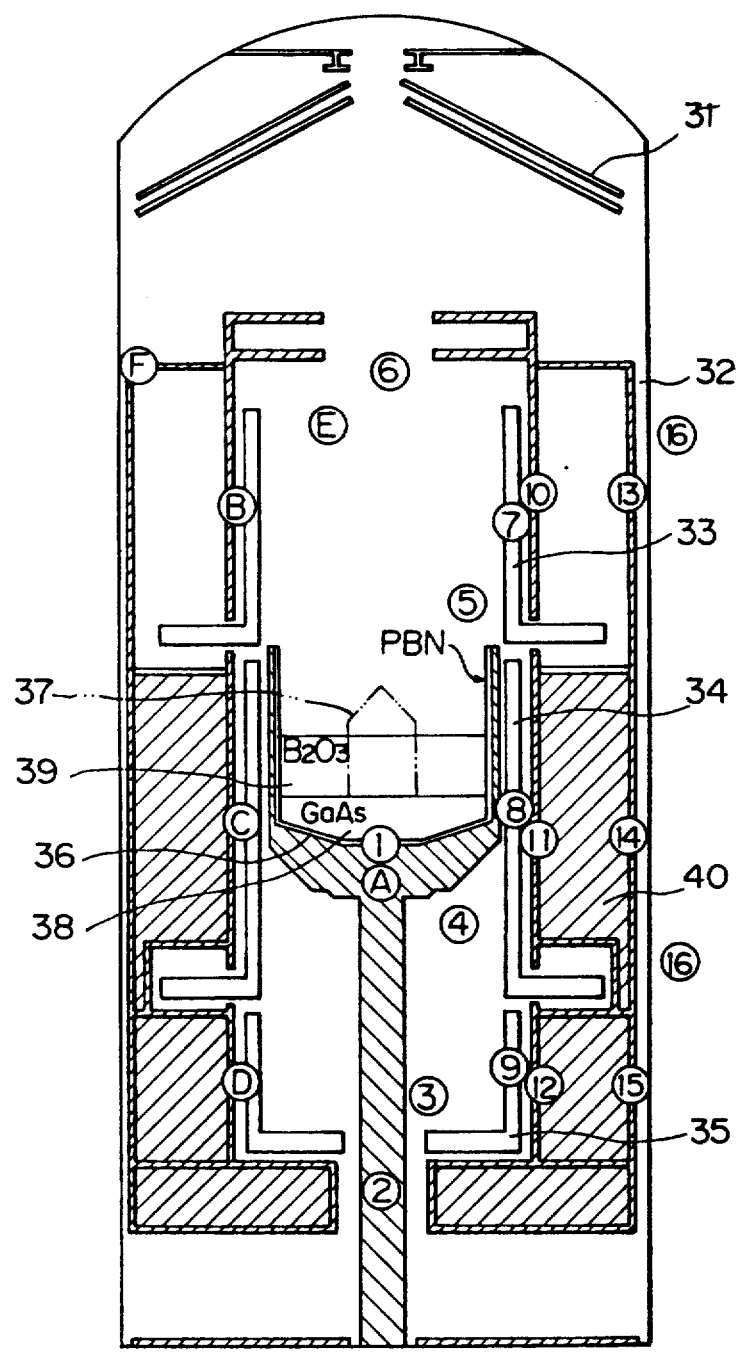
FIG. 1 is a schematic cross-sectional view of a single crystal pulling apparatus used in an LEC process.
Figure 2:
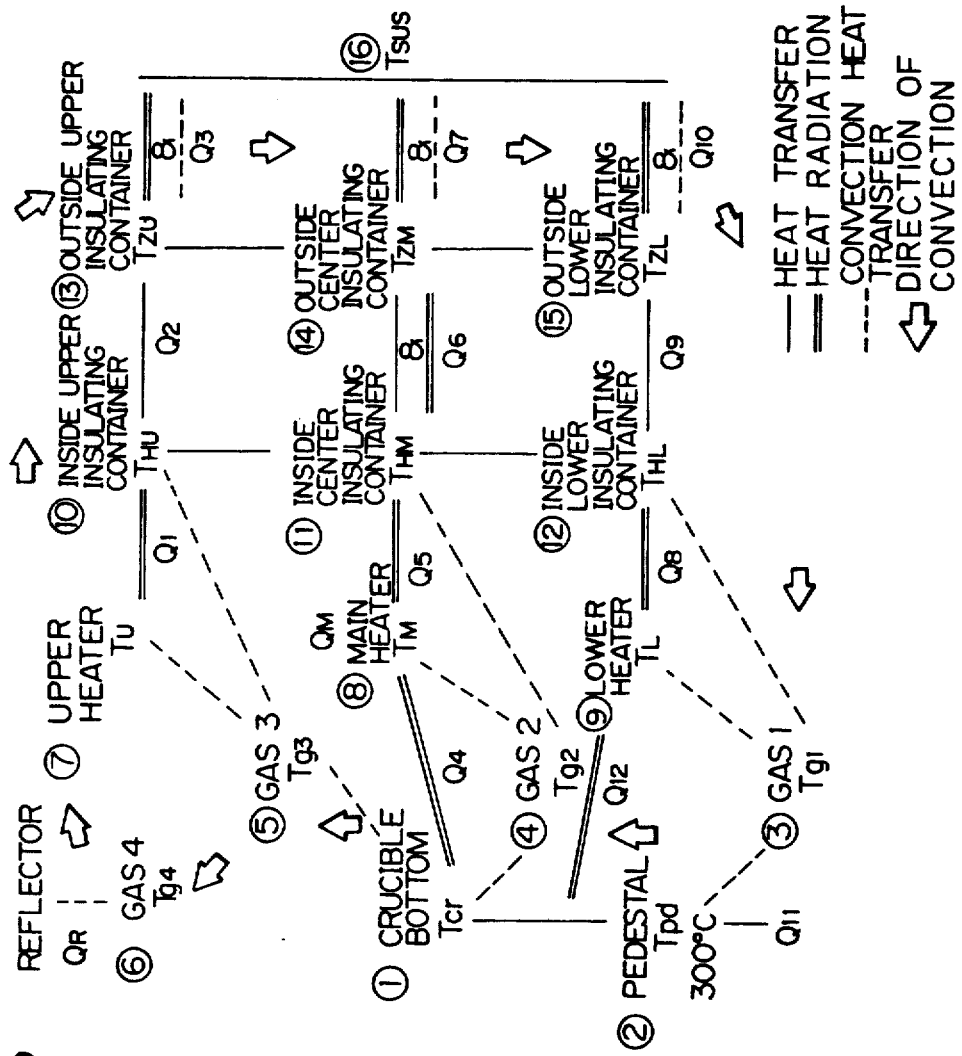
FIG. 2 is a view illustrating a heat balance model in an apparatus.

The inventors investigated the effect of the Ar flow on the thermal balance in the chamber shown in FIGS. 1 and 2, and found that the results shown in Table 1, wherein two pressure states, i.e., −14 psi and 233 psi, were tested, were obtained at a main heater monitoring temperature of 1285° C.

TABLE 1

| pressure (psi) | 233 | −14 |
|---|---|---|
| electrical power of main heater (kW) | 11.5 | 6.5 |
| temperature at gas entrance (°C.) | 150 | — |
| temperature at gas exit (°C.) | 640 | — |

When the electrical power of the upper heater which above the substrate and the lower heater which is below the substrate was set to 0, and the sectional area S=104 cm$^2$, $\rho = 6.12 \times 10^{-3}$ g/cm$^3$, and $C_p = 0.52$ J/gK, q=5000 W, $\Delta T = 500°$ C., and V=30 cm/sec were obtained from these settings.

Therefore, if the gas flow rate at the entrance is determined, the gas flow rate at each point can be determined by determining the convection in the apparatus in accordance with the gas flow rate at the entrance. Therefore, since a temperature profile can be obtained from the heater power of a heating source and the gas flow rate at the entrance, an apparatus internal temperature profile and the heater temperature profile preset as a boundary conventional condition can be obtained.

Figure 4:
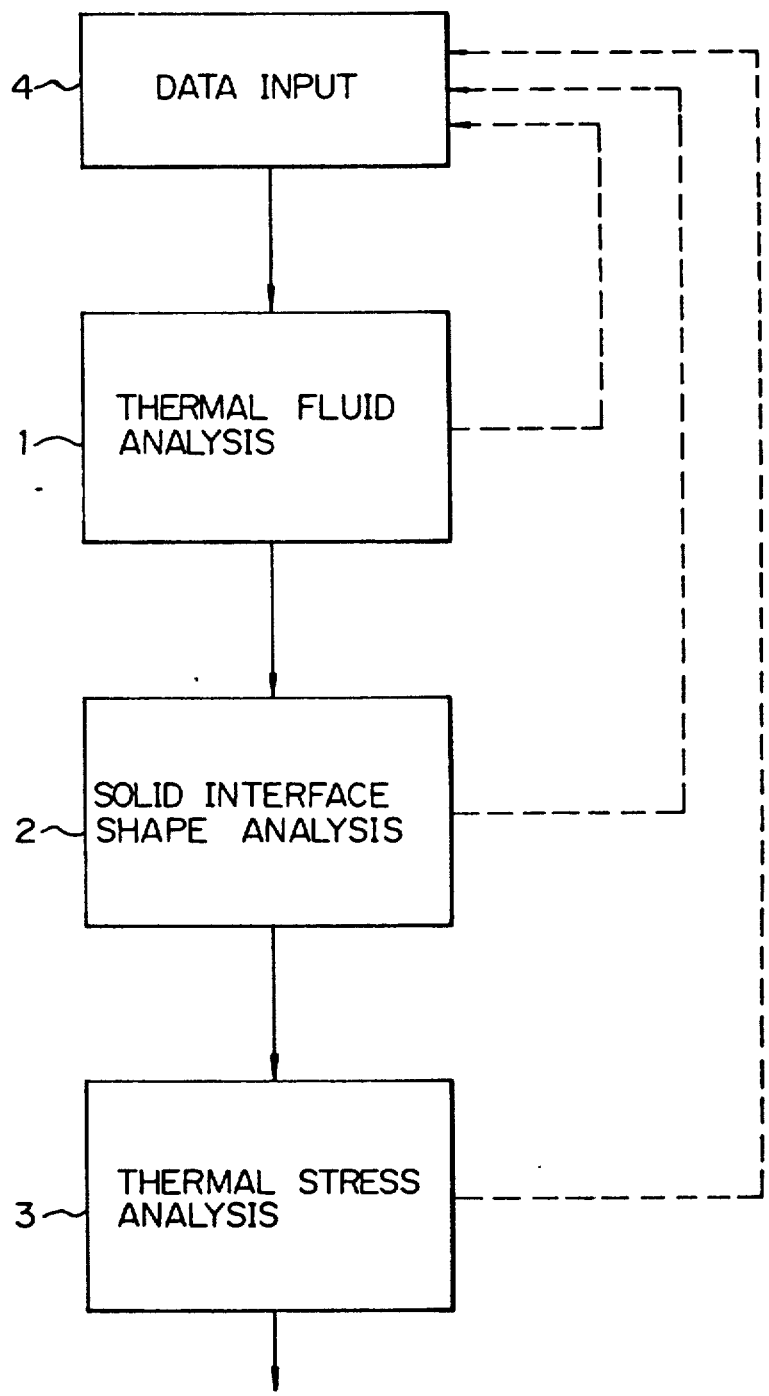
FIG. 4 is a schematic block diagram of the structure of a system according to the present invention.

Now, an optimum condition analysis for a single crystal pulling apparatus, wherein a system for presetting an initial value for thermal analysis of the fluid inside the apparatus according to the present invention was applied, will be explained. FIG. 4 shows a schematic block diagram of a structure of the system according to the invention.

In the optimum condition analysis system shown in FIG. 4, an apparatus internal pressure, upper heater power, lower heater power, a crucible position, a heater shape, and a $B_2O_3$ thickness, etc., are preset as a case study. Further, a temperature of an outer wall of a hot zone or gas flow rate and gas temperature at the entrance are preset as boundary conditions, and in addition, values such as a heater power, apparatus internal pressure and an analysis mesh shape, etc., are preset, to enable a simulation analysis to be carried out.

The simulation analysis is characterized in that it is evaluated by dividing the analysis into three portions, i.e., a thermal fluid analysis portion 1, a solid-liquid interface shape analysis portion 2, and a thermal stress analysis portion 3.

In the thermal fluid portion 1, a convection is determined from a gas flow rate at the entrance, and a temperature profile is obtained by connecting the convection and heat radiation.

In the solid-liquid interfacial shape analysis portion 2, while noting a temperature of the crystal and melt from the apparatus internal temperature profile, the apparatus internal temperature profile is considered a boundary condition, and a thermal analysis of the crystal and melt is carried out to obtain a solid-liquid interfacial shape.

In the thermal stress analysis portions, a thermal stress in a crystal is obtained from the solid-liquid interfacial shape and the temperature profile of the crystal obtained in the solid-liquid interfacial analysis portion 2.

In a data input portion 4, initial data of a case or boundary condition and a heater power, etc., are input. The evaluation of the results of analyses is carried out in the respective portions step by step. If a condition at one stage cannot be satisfied, a simulation is repeated by resetting data after returning to the data input portion 4. Thereafter, a feedback to the data input portion 4 is carried out so that the optimum conditions can be obtained at the respective stages, with the result that an optimum control condition can be finally obtained from the thermal stress analysis portion 3.

The system of the invention is used for carrying out the design of an optimum heat environment in the apparatus, to grow a single crystal with less strain. If the system is used a condition in which a high quality single crystal can be drawn under conditions in which an apparatus is not broken can be introduced without actually carrying out the crystal growth. Therefore, the temperature profile in the apparatus and near the crystal is very important.

For example, reviews of whether a preset crucible shape can be used or not in a given vessel or how big a crucible can be used, a review of a shape effect of a hot zone of a heater and an insulating material, and reviews of the arrangement of the heater and the determination of the optimum power ratio of the heater can be carried out. In this case, if the obtained results of the analysis are within preset criteria, it can be found that the boundary condition is at the correct temperature.

For example, when a diameter of a crucible is enlarged by 2 inches, the thickness of the insulating material of the outer periphery portion become 1 inch thinner. Under the condition that a crucible shape is changed, when an apparatus interior is heated by a heater, the safety of the apparatus when, for example, a necessary heater power is abnormally increased, is confirmed and the position of the crucible and the length of the heater, etc., are determined.

Further as a criterion of a condition for pulling a high quality crystal, the solid-liquid interface shape and the crystal thermal stress are considered. To lessen defects of the crystal, the temperature gradient in the crystal must be reduced, and accordingly, information on the temperature profile in the crucible becomes important. The temperature profile in the crucible is obtained with reference to the temperature profile in the apparatus.

The analysis at each block will now be explained in detail.

Figure 5:
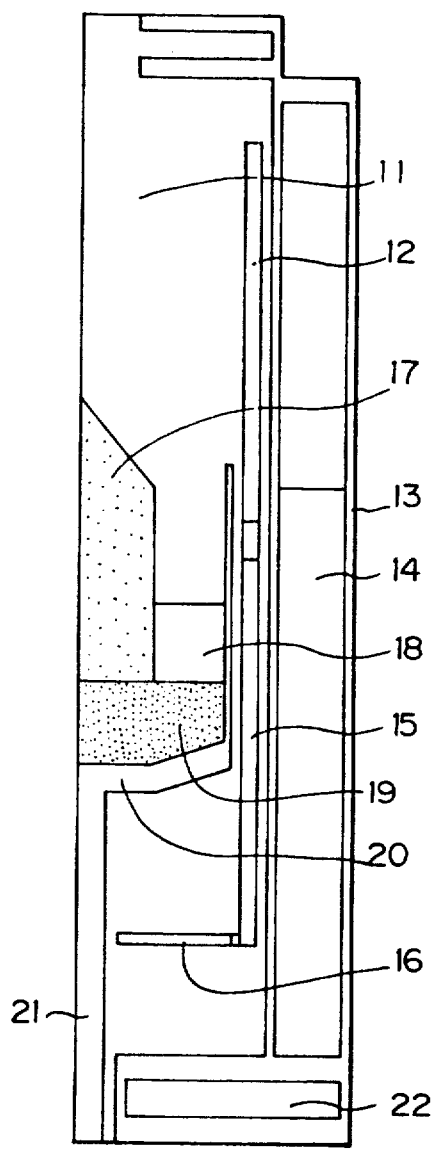
FIG. 5 is a schematic view of an example of a review model.
Figure 6:
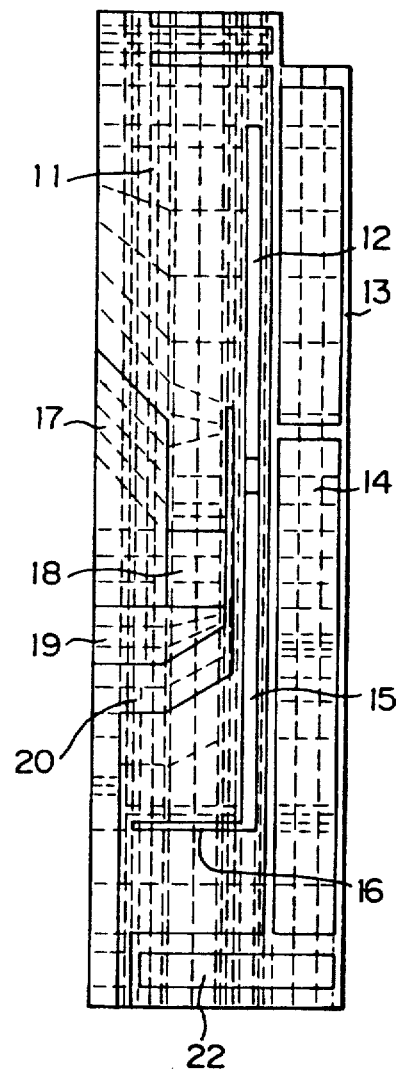
FIG. 6 is a view of an example of a mesh division of the review model shown in FIG. 5.
Figure 9:
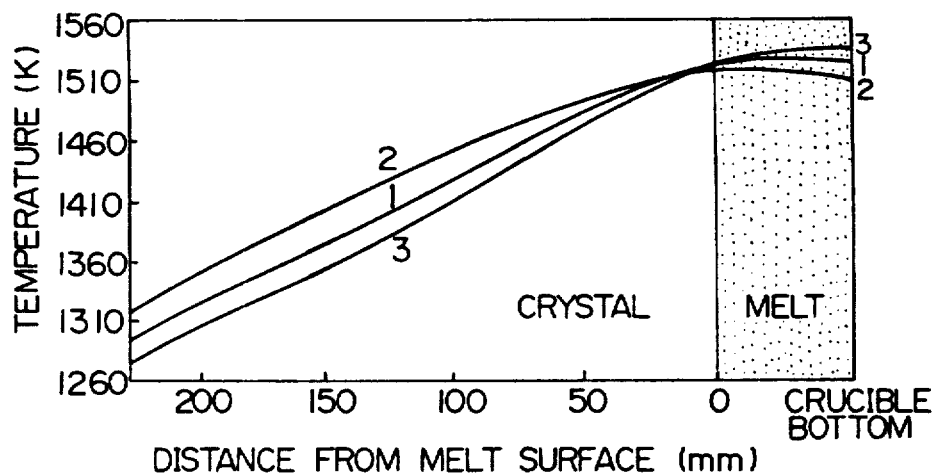
FIG. 9 is a view of a relationship between a temperature of a crucible and a position of a crystal and a melt.
Figure 10:
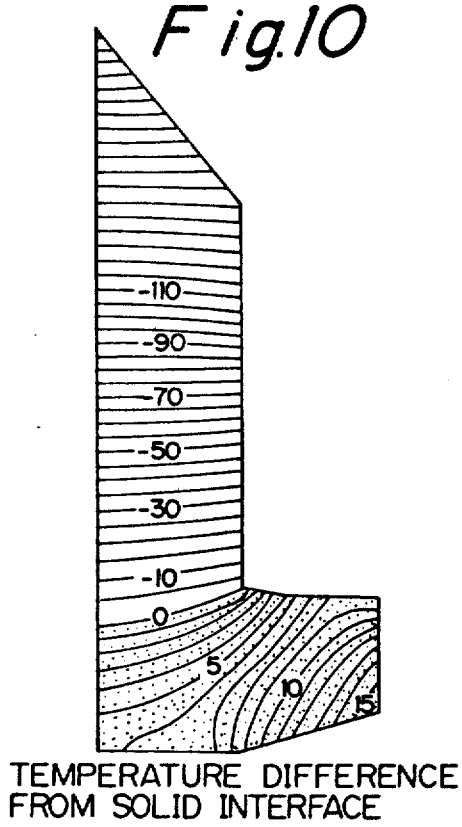
FIG. 10 is a view of an example of a temperature profile of a crystal and melt and a shape of a solid-liquid interface; and, FIG. 11 is a view of an example of thermal stress.
Figure 11:
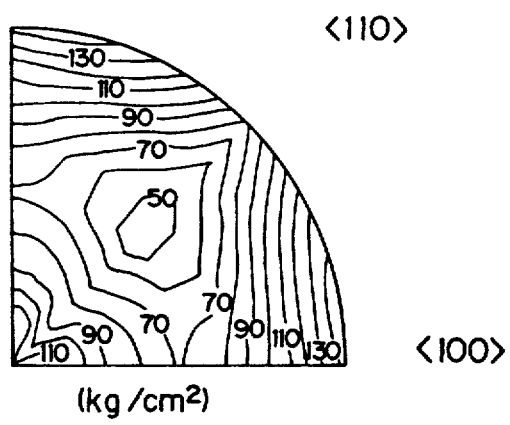

FIG. 5 is a schematic view of an example of a reviewed model, and FIG. 6 is a view of an example of a mesh division of the model in FIG. 5; FIG. 7 is a view of an example of an apparatus internal gas flow; FIG. 8 is a view of an example of an apparatus interior temperature profile; FIG. 9 is a view of a relationship between a temperature at a crucible position and of a crystal and melt; FIG. 10 is a view of an example of the temperature profile of a crystal and melt and a solid-liquid interfacial shape; and FIG. 11 is a view of an example of thermal stress.

In FIG. 5, reference numeral 11 denotes an Ar atmosphere, 12 an upper heater, 13 a graphite, 14 and 22 insulating felt, 15 a main heater, 16 a lower heater, 17 a GaAs crystal, 18 $B_2O_3$, 19 a GaAs melt, and 20, 21 a crucible.

In a thermal fluid analysis, with respect to a model to be reviewed an apparatus interior is mesh-divided as shown in FIG. 6 by using a finite element method, so that an optional shape is considered. For example, the length of a heater can be optionally selected. In the mesh division model, the physical properties values of various materials are defined, and by changing the length and the position of the heater, the position of the crucible and the quantity of growth of the crystal by using the mesh division, a simulation is carried out. Therefore, in this simulation, as boundary conditions, an outer wall temperature, gas flow rate at the entrance, and the gas temperature are set, and as an initial value, a crucible shape such as a diameter, a heater length, a mesh condition due to the value of the physical property of the apparatus internal structure, and a heater power are set.

By these settings, an apparatus internal Ar gas flow shown in FIG. 7 and an apparatus internal temperature profile shown by isotherms 1, 2 . . . in FIG. 8 are obtained. Then, from these results, each function is analyzed and the possibilities of a change of conditions and of pulling the crystal are evaluated. In this case as explained above, if the given boundary condition is within the preset criteria, the boundary temperature condition is correct.

The convergent judgement of the thermal fluid analysis is carried out when the temperature of the solid-liquid interface approaches the melting point. When the heater power is changed, the gas flow rate at the entrance is also changed in accordance with a trial test data, and therefore, the simulation analyses are repeated. The determination of the gas flow rate v at the entrance is carried out by an expression $v = f(T_M)$; where $T_M$ denotes temperature of the main heater.

Since the interior of the apparatus contains a high pressure (for example, 10 or more atm.) inactive gas, for example, Ar, when the apparatus interior is heated by the heater, a convection of the gas is generated, and the gas flow becomes important. When the shape, etc. of the heater is changed, the heat radiation at a high temperature is influenced by the fourth power of the distance. When the heater power is changed, the gas flow rate at the entrance is also changed, the convection is determined, and a temperature profile is obtained by a combination of the convection and a heat transition. Therefore, in the thermal fluid analysis, a macro temperature profile is analyzed. The heat transfer is at a high temperature and under a high pressure, and thus an analysis using the heat radiation and gas becomes important.

A Navier-Stokes equation in which various heat flows such as heat transfer, heat radiation, and convection are combined, is applied to the gas portion, and a heat transfer equation in which the radiation between each surface is considered is applied to the structural sections so that a computation can be carried out. In this case if the design and setting of a multi-stage heater and the setting of a crystal pulling position are not suitably carried out, pulling of the crystal becomes impossible. The solid-liquid interface between the crystal and the melt is actually moved in accordance with the thermal balance state, but at this stage, it is supposed as flat by the mesh division.

Then, in the solid-liquid interfacial shape analysis, while using the temperature data as a boundary condition, a thermal analysis of the crystal melt portion is subsequently carried out and a solid-liquid interfacial shape is analyzed from the temperature profile shown in FIG. 10. The solid-liquid shape is obtained as an isothermal line of a melting point temperature from the temperature profile, and the heater power is set so that the solid-liquid interfacial shape becomes a desired solid-liquid interfacial shape. To stabilize the growth of the crystal, a flat solid-liquid interfacial shape must be kept constant. Preferably, however, the temperature gradient is reduced at a portion. When the growth condition is changed, however, the manner of the heat transfer is changed and the method for control of the crystal pulling cannot maintain a constant value thereof. By applying, for example, a heat transfer equation to the crystal and by applying a thermal fluid analysis considering a convection in the melt to the melt, a limited condition at which the solid-liquid interface reaches melting point is given, and a free boundary problem can be solved.

FIG. 9 shows the relationship between a temperature at the center axis of the crystal and melt and the position of the crucible, using the result of the crucible internal thermal analysis. As apparent from this example, when the position of the crucible is changed, the temperature gradient of the crystal and the temperature of the melt are changed, and thus a suitable setting of the crucible position is important. Where the temperature at the melt below the solid-liquid interfacial portion becomes lower than the melting point, regardless of the basis one-directional solidification, the crystal growth is stopped, and an evaluation of this phenomena is needed.

Further, when the power of each of the upper heater, the main heater, and the lower heater is changed, the temperature gradient and the temperature profile is changed.

By using the FIG. 10 showing a temperature gradient and a temperature profile with an isothermal line in which temperature differences from the solid-liquid interface is shown by 1, 2 . . . as keeping the solid-liquid interface 0, various analyses of whether or not the crystal temperature gradient near the solid-liquid interface is suitable for pulling a high quality crystal, and whether or not the melt station is good, can be carried out. Further, the optimum shape of a solid-liquid interface or a uniform growth of a crystal can be analyzed and evaluated.

The thermal stress analysis is carried out by using a temperature profile at the solid-liquid interfacial shape obtained by a solid-liquid interfacial shape analysis. On the other hand, to obtain a high quality crystal, a small and uniform stress is preferable. Namely, although the final aim is to produce a crystal having little strain, to carry out a thermal stress analysis based on the shearing thermal stress profile, heat history shown in FIG. 11 is required and a reduction of the thermal stress is necessary. Many studies of a relationship between the thermal stress and the crystal defect have been carried out, and the thermal stress analysis has been established as one evaluation of a high quality crystal.

As explained above, while separating analyses into three portions, and organically connecting the data to the next portion, analyses are carried out in turn, with the result that an effect, etc., of a multi-divisional heater can be easily analyzed by repeating a simulation of a stage by an evaluation of the results of intervening running analyses. For example, from the temperature profile of the crystal and melt, by carrying out a repeated simulation while changing the set of the heater power, an analysis of how the temperature profile is changed in accordance with a change of the distribution of the heater power can be carried out. Therefore, when the portion which is to become a solid-liquid interface has a temperature of 1500° K., a heater power distribution such that the portion becomes 1511° K. of the melting point can be easily carried out without wasting time, as the analysis is repeated after return to a unit portion.

Further, as a case study, where the apparatus internal pressure is changed, the upper heater power or the lower heater power is changed, the shape of the heater is changed, the position of the crucible is changed, the thickness of $B_2O_3$ encapsulant is changed, etc., the changes of the temperature profile can be analyzed in a short time, and the optimum pressure and the optimum heater power which constitute the optimum operating condition can be efficiently obtained. The heater shape or the position of the crucible and the thickness of $B_2O_3$ encapsulant or the like may be analyzed by changing only a mesh shape. The above-mentioned means can be used to control the single crystal pulling apparatus as is. In this case, since the optimum design of the apparatus had been completed by the above-explained analyses, an apparatus shape or an solid-liquid interfacial condition among an apparatus internal condition, a solid-liquid interfacial condition, and a heater power condition become fixed data. On the other hand, a crystal pulling speed or a rotating speed of a crucible and a crystal, heater power, etc. are variables derived from the pulling of the crystal, and these variables may be successively compensated while pulling the crystal.

Therefore, as an overall structure by which a control of a single crystal pulling apparatus is carried out, a condition setting portion in which the apparatus interior, solid-liquid interface, and heater power conditions are set, a monitoring portion monitoring an operating state for pulling a single crystal in an apparatus, and a control portion in which the single crystal pulling is controlled while monitoring same by a monitoring means using the condition set by the condition setting means as a control signal, may be connected to the thermal fluid analyzing portion 1, the solid-liquid interface analyzing portion 2 and the thermal stress analyzing portion 3.

In the analyzing portions 1, 2, and 3, references for evaluating and determining are set at respective stages. For example, reference values regarding a temperature at a specified position in an apparatus and a position of a solid-liquid interface, etc., are set, and the results of the analysis by the thermal fluid analyzing portion 1 and the solid-liquid interfacial shape analyzing portion 2 are compared with the reference values, to evaluate and determine the condition of the condition setting portion is compensated in turn.

For example, the position of the crucible is varied in accordance with the crystal pulling speed. In the monitoring portion, the detection of crystal weight by using a load cell, detection of a temperature at each point by using a thermocouple, and detection of a crucible and crystal rotating speed by using an encoder provided at a motor, and a motor driving current, are carried out.

In the control portion the detected data in the monitoring portion is fed back to satisfy the conditions set by the condition setting portion, and the control of the heater power and control of the rotation of a crucible and growing crystal is carried out, and thus a high quality crystal analyzed by the thermal fluid analyzing portion 1, the solid-liquid interfacial shape analyzing portion 2, and the thermal stress analyzing portion 3 can be efficiently produced. Further, the detected data of the monitoring portion is also fed back to each analyzing portion and may be used for the evaluation of the results of the analysis and as the base data for the determination.

The present invention is not limited to the above described example, and various modifications thereof can be made.

For example, in the above example although the gas flow rate at the entrance is obtained from the heater power difference where the apparatus internal pressure is changed from a vacuum to a pressure during the operation, and the heater power temperature is maintained at a constant value, and by the difference between the gas temperature at the entrance and the gas temperature at the exit, the pressure may be varied during the operation and the same trial test may be carried out by changing the heater monitoring temperature.

The analysis of the optimum condition of the single crystal pulling apparatus has the characteristic that the thermal fluid analysis, solid-liquid interfacial shape analysis, and the thermal stress analysis are independently carried out as units of the analysis, and these unit are dependently connected to each other.

For example, after evaluating the respective results of the thermal fluid analysis, the solid-liquid interfacial shape analysis, and the thermal stress analysis, the condition of a simulation is varied so that the optimum condition of the apparatus internal heat environment is set.

In another example, however, to evaluate the results, of these analysis, a parameter for the evaluation and condition changes of the simulation may be set, or the setting of the simulation condition may be automatically changed by adding a study function. Further, the system of the invention may be assembled to the control system of the single crystal pulling apparatus.

Since the temperature of the heater and the apparatus internal pressure are constantly monitored, the monitored data and the above-mentioned data of the crystal weight obtained by the load cell are input, and this data is fed back to control the temperature of the heater.

We claim:

1. A method of obtaining optimum operating conditions of a single crystal pulling apparatus heated by a heater and subjected to a high pressure of a high pressure inert gas by simulating an operation of the apparatus by employing an electric computer and a finite-element method to thereby conduct a thermal analysis of fluids used for growing a single crystal inside the apparatus, the simulating of the operation of the apparatus being conducted by setting in the computer a temperature and a flow rate of the gas entering the apparatus through an entrance of said apparatus and a temperature of a wall of the apparatus defining a chamber therein for growing the single crystal as boundary conditions, and by giving a pattern of an analysis mesh for the finite-element method, a pressure value inside the apparatus and an output power of the heater to the computer as initial values, wherein the method of obtaining optimum conditions in said single crystal pulling apparatus comprises:

establishing a relationship between an output power of said heater by which a temperature detected by a temperature monitor arranged in said simulated apparatus is maintained at a constant value and the flow rate of said gas entering said apparatus, while changing a pressure value inside said apparatus on the basis of data given by a trial experiment; and repeating said simulating of the operation of said apparatus by changing said flow rate at said entrance of said apparatus in accordance with changes in said initial values of said output power of said heater and said pressure value inside said apparatus until said optimum operating condition is obtained.

2. The method according to claim 1, wherein said relationship between said output power of said heater and said flow rate of said gas at said entrance of said apparatus is obtained from a difference in said output power of said heater caused by changing said pressure value inside said apparatus from a vacuum level to a pressure level, during the operation of said apparatus, and a difference between the temperature of the gas at said entrance of said apparatus and the temperature of the gas at an exit of said apparatus.

3. The method according to claim 1, wherein said simulating of the operation of said single crystal pulling apparatus is carried out by first conducting a thermal fluid analysis to obtain an apparatus internal temperature profile, subsequently making a thermal analysis of crystal and melt portions to thereby obtain a solid-liquid shape from said first obtained apparatus internal temperature profile, and making a thermal stress analysis to thereby obtain a thermal stress in the single crystal from said obtained solid-liquid interfacial shape and a temperature profile in said single crystal.

4. The method according to claim 3, wherein said optimum operating condition of said single crystal pulling apparatus is obtained by repeating said simulating of the operation of said apparatus, while changing said output power of said heater in accordance with a change in said apparatus internal pressure, a position of a crucible accommodated in said apparatus, and the shape of said heater.

5. An arrangement for simulating an operation of a single crystal pulling apparatus to obtain an optimum operating condition of the apparatus comprising:

a thermal fluid analysis means in which an analysis of said apparatus internal temperature is carried out based on the internal condition of a set apparatus, the boundary condition, and the heater power;

a solid-liquid interfacial shape analysis means in which a thermal analysis of a crystal and melt is carried out using the temperature profile obtained by said thermal fluid analysis means as a boundary condition so that a solid-liquid interfacial analysis in said crystal and melt is carried out; and a thermal stress analysis means in which an analysis of a thermal stress in said crystal is carried out by using the solid-liquid interfacial shape of the crystal obtained by said solid-liquid interfacial shape analysis means, and a temperature profile.

6. A control apparatus for controlling an operation of a single crystal pulling apparatus comprising:

a condition setting means by which the apparatus internal condition, the boundary condition, and heater power are set;

a thermal fluid analysis means by which an analysis of the apparatus internal temperature profile is carried out based on the condition set by said condition setting means;

a solid-liquid interfacial shape analysis means in which a thermal analysis of the crystal and melt is carried out by using the temperature profile obtained by said thermal fluid analysis means as a boundary condition whereby a solid-liquid interfacial analysis in said crystal and melt is carried out;

a thermal stress analysis means by which an analysis of a thermal stress in said crystal is carried out by the solid-liquid interfacial shape of the crystal obtained by said solid-liquid interfacial shape analysis means, and a temperature profile;

a monitoring means for monitoring an operating state when pulling a single crystal; and a control means for controlling the pulling of the single crystal while a monitoring is carried out by said monitoring means using the condition set by said condition setting means as a control signal, said system being constructed in such a manner that the conditions set by said condition setting means being appropriately compensated by evaluations of results of the analysis by said thermal fluid analysis means, said solid-liquid interfacial shape analysis means, and said thermal stress analysis means.

* * * * *